US010903862B2

(12) United States Patent
Kranz et al.

(10) Patent No.: US 10,903,862 B2
(45) Date of Patent: Jan. 26, 2021

(54) APPARATUS AND A METHOD FOR AMPLIFYING AN INPUT SIGNAL

(71) Applicant: Intel IP Corporation, Santa Clara, CA (US)

(72) Inventors: Christian Kranz, Ratingen (DE); Stephan Henzler, Munich (DE)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 16/550,349

(22) Filed: Aug. 26, 2019

(65) Prior Publication Data

US 2020/0076456 A1 Mar. 5, 2020

Related U.S. Application Data

(63) Continuation of application No. 15/811,869, filed as application No. PCT/IB2016/053362 on Jun. 8, 2016, now Pat. No. 10,439,658.

(30) Foreign Application Priority Data

Jun. 25, 2015 (DE) .......................... 10 2015 110 274

(51) Int. Cl.
*H03F 3/45* (2006.01)
*H04B 1/04* (2006.01)
(Continued)

(52) U.S. Cl.
CPC .............. *H04B 1/04* (2013.01); *H03F 1/083* (2013.01); *H03F 1/34* (2013.01); *H03F 3/19* (2013.01);
(Continued)

(58) Field of Classification Search
CPC ........................................................ H03F 3/45
(Continued)

(56) References Cited

U.S. PATENT DOCUMENTS 6,587,004 B2 * 7/2003 Ide .......................... H03F 3/087
   250/214 A
8,207,777 B1 * 6/2012 DiTommaso ............ H03G 7/08
   327/352
(Continued)

FOREIGN PATENT DOCUMENTS

CN      1292168 A      4/2001
CN    101273318 A      9/2008
(Continued)

OTHER PUBLICATIONS

Guo-ding Dai et al.: "Adaptive Slope Compensation Circuit with High Stability for Improving Load Capability", Journal of University of Electronic Science and Technology of China, vol. 43, No. 2, Mar. 2014.

(Continued)

*Primary Examiner* — Henry Choe
(74) *Attorney, Agent, or Firm* — 2SPL Patent Attorneys PartG mbB; Kieran O'Leary

(57) ABSTRACT

An apparatus for amplifying an input signal is provided. The apparatus includes an output stage to generate an output signal. The apparatus further includes a compensation signal generator configured to generate a compensation signal based on at least one of a voltage value of the input signal or a voltage value of the output signal. The apparatus further includes a combiner configured to generate a control signal for the output stage based on a target signal, the compensation signal and a signal related to a current value of the output stage. The target signal corresponds to a desired output signal. The output stage is configured to generate the output signal using the control signal.

13 Claims, 10 Drawing Sheets

(51) Int. Cl.
*H03F 1/08* (2006.01)
*H03F 1/34* (2006.01)
*H03F 3/217* (2006.01)
*H03F 3/19* (2006.01)

(52) U.S. Cl.
CPC ....... *H03F 3/2173* (2013.01); *H03F 3/45475* (2013.01); *H03F 2200/129* (2013.01); *H03F 2200/451* (2013.01); *H03F 2200/91* (2013.01); *H03F 2203/45116* (2013.01); *H03F 2203/45528* (2013.01); *H03F 2203/45702* (2013.01); *H04B 2001/0408* (2013.01)

(58) Field of Classification Search
USPC .......................................... 330/252, 260, 261
See application file for complete search history.

(56) References Cited

U.S. PATENT DOCUMENTS

2006/0132235 A1* 6/2006 Ozawa ................ H03F 3/45475
330/254
2010/0060250 A1 3/2010 Noda
2011/0101932 A1 5/2011 Nakazono
2012/0146727 A1* 6/2012 Cyrusian ............... H03F 3/2173
330/261

FOREIGN PATENT DOCUMENTS

| CN | 101882871 A | 11/2010 |
| CN | 103762842 A | 4/2014 |
| CN | 104539154 A | 4/2015 |
| KR | 100921986 B1 | 10/2009 |

OTHER PUBLICATIONS

Chihiro Kawabata et al.: "A Current-mode DC-DC Converter using a Quadratic Slope Compensation Scheme", IEEE 2009, 978-1-4244-2749-9/09, pp. 113-114.

* cited by examiner

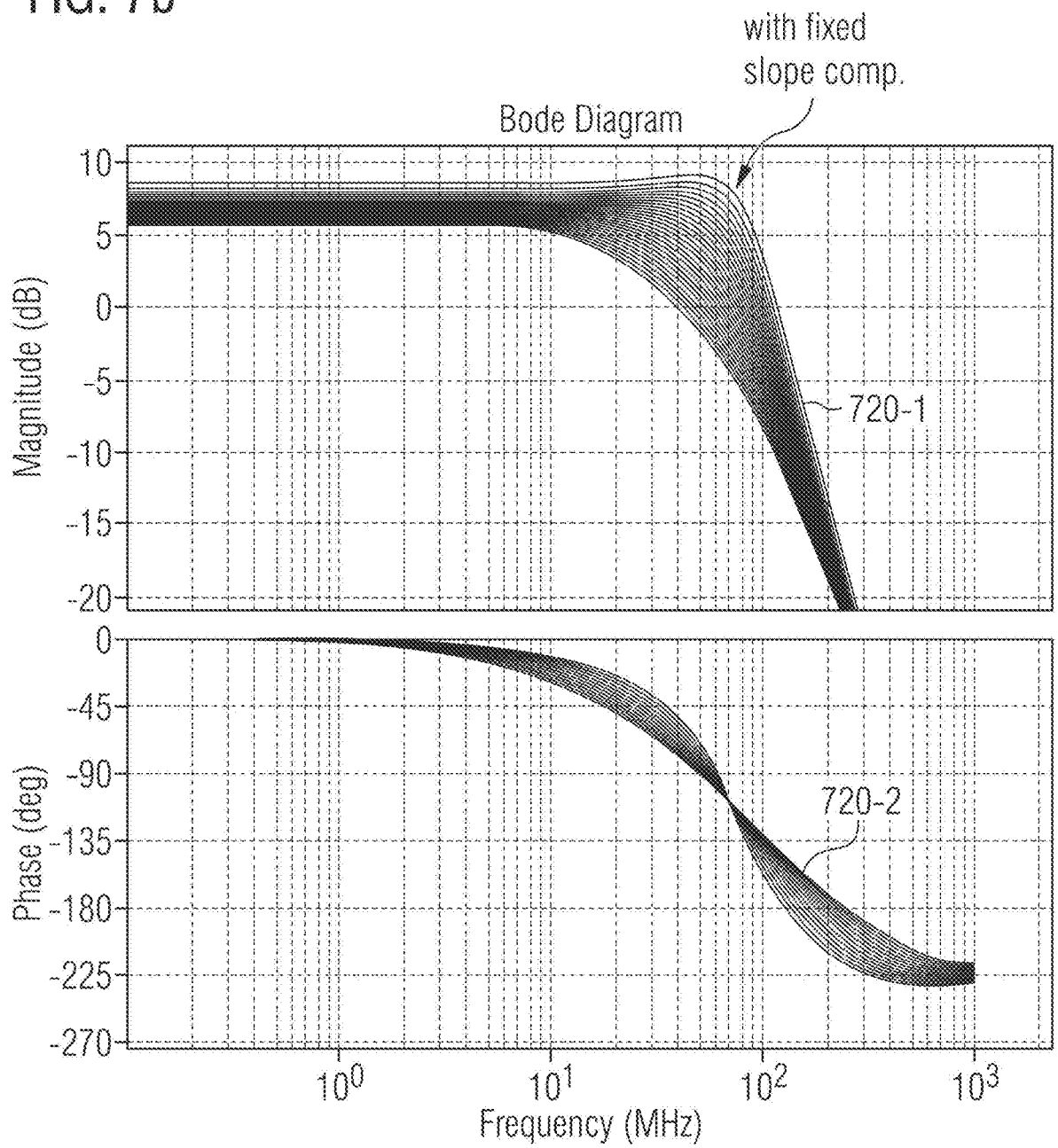

APPARATUS AND A METHOD FOR AMPLIFYING AN INPUT SIGNAL

CROSS-REFERENCE TO RELATED APPLICATIONS

This application is a continuation of U.S. application Ser. No. 15/811,869 filed on Nov. 14, 2017, which was a 35 U.S.C. § 371(c) national stage entry of PCT/IB2016/053362. PCT/IB2016/053362, filed on Jun. 8, 2016, claimed priority to German Application 10 2015 110 274.9, filed on Jun. 25, 2015. The contents of the earlier filed applications are incorporated by reference herein in their entirety.

FIELD

Examples relate to amplifiers with current mode controlled output stages. In particular, some examples relate to an apparatus and a method for amplifying an input signal. Some examples relate to a slope compensation signal generator for a current mode controlled driver of an amplifier and a method for controlling a current mode controlled driver of an amplifier.

BACKGROUND

Current mode control is a known solution to control a DC-to-DC converter. A DC-to-DC converter generally provides a constant output voltage or small output voltage range (e.g. a few hundred millivolt). However, the current mode control may suffer from instability when a duty cycle of its output control signal is higher or lower than 50%, i.e., instabilities may be caused if the output control signal is active for more or less than half of the signal period. In order to avoid instability, slope compensation is used.

Although its principles of operation may correspond to those of a DC-to-DC converter, conventional approaches for slope compensation may not be used for current mode control of an amplifier's output stage since the output stage of an amplifier provides a full-swing output voltage instead of a constant voltage or a small output voltage range like a DC-to-DC converter. For example, an amplifier's output stage may provide a signal having a form substantially equal to a sine wave. The amplifier's output signal may have a dynamic range up to several Volts, swinging from one end of the output range to the other within short time instants. With the full-swing output voltage having a higher dynamic range compared to an output range of a DC-to-DC converter, conventional approaches for slope compensation may generate disturbances and distortions at the output of the amplifier's output stage or do simply not work. Hence, there may be a desire for improved current mode control for an amplifier.

BRIEF DESCRIPTION OF THE FIGURES

Some examples of apparatuses and/or methods will be described in the following by way of example only, and with reference to the accompanying figures, in which:

FIG. 7*b* illustrates an example of a transfer function of a current mode controller according to the state of the art;

DETAILED DESCRIPTION

Figure 1:
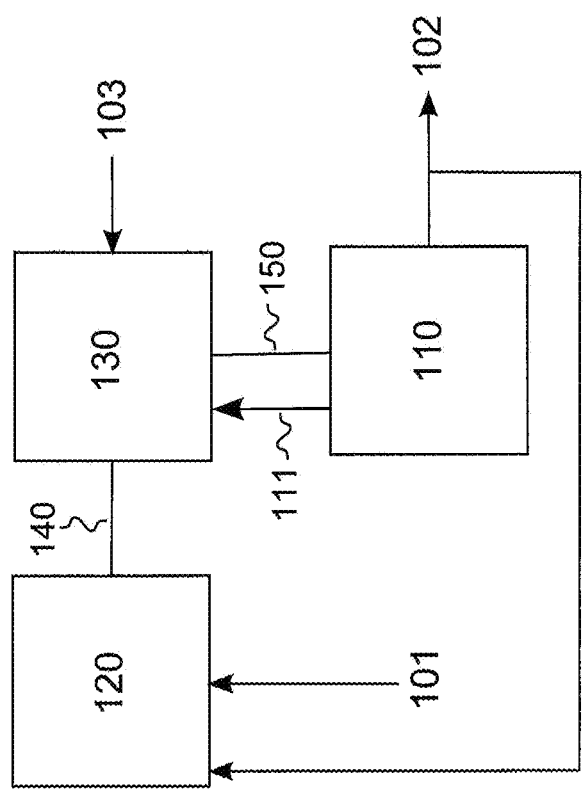
FIG. 1 illustrates an example of an apparatus for amplifying an input signal.

Various examples will now be described more fully with reference to the accompanying drawings in which some examples are illustrated. In the figures, the thicknesses of lines, layers and/or regions may be exaggerated for clarity.

Accordingly, while further examples are capable of various modifications and alternative forms, some examples thereof are shown by way of example in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of further examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art, unless expressly defined otherwise herein.

In the following, various examples relate to devices (e.g. cell phone, base station) or components (e.g. transmitter, transceiver) of devices used in wireless or mobile communications systems. A mobile communication system may, for example, correspond to one of the mobile communication systems standardized by the 3rd Generation Partnership Project (3GPP), e.g. Global System for Mobile Communications (GSM), Enhanced Data rates for GSM Evolution (EDGE), GSM EDGE Radio Access Network (GERAN), High Speed Packet Access (HSPA), Universal Terrestrial Radio Access Network (UTRAN) or Evolved UTRAN (E-UTRAN), Long Term Evolution (LTE) or LTE-Advanced (LTE-A), or mobile communication systems with different standards, e.g. Worldwide Interoperability for Microwave Access (WIMAX) IEEE 802.16 or Wireless Local Area Network (WLAN) IEEE 802.11, generally any system based on Time Division Multiple Access (TDMA), Frequency Division Multiple Access (FDMA), Orthogonal Frequency Division Multiple Access (OFDMA), Code Division Multiple Access (CDMA), etc. The terms mobile communication system and mobile communication network may be used synonymously.

The mobile communication system may comprise a plurality of transmission points or base station transceivers operable to communicate radio signals with a mobile transceiver. In these examples, the mobile communication system may comprise mobile transceivers, relay station transceivers and base station transceivers. The relay station transceivers and base station transceivers can be composed of one or more central units and one or more remote units.

A mobile transceiver or mobile device may correspond to a smartphone, a cell phone, User Equipment (UE), a laptop, a notebook, a personal computer, a Personal Digital Assistant (PDA), a Universal Serial Bus (USB)-stick, a tablet computer, a car, etc. A mobile transceiver or terminal may also be referred to as UE or user in line with the 3GPP terminology. A base station transceiver can be located in the fixed or stationary part of the network or system. A base station transceiver may correspond to a remote radio head, a transmission point, an access point, a macro cell, a small cell, a micro cell, a pico cell, a femto cell, a metro cell etc. The term small cell may refer to any cell smaller than a macro cell, i.e. a micro cell, a pico cell, a femto cell, or a metro cell. Moreover, a femto cell is considered smaller than a pico cell, which is considered smaller than a micro cell. A base station transceiver can be a wireless interface of a wired network, which enables transmission and reception of radio signals to a UE, mobile transceiver or relay transceiver. Such a radio signal may comply with radio signals as, for example, standardized by 3GPP or, generally, in line with one or more of the above listed systems. Thus, a base station transceiver may correspond to a NodeB, an eNodeB, a BTS, an access point, etc. A relay station transceiver may correspond to an intermediate network node in the communication path between a base station transceiver and a mobile station transceiver. A relay station transceiver may forward a signal received from a mobile transceiver to a base station transceiver, signals received from the base station transceiver to the mobile station transceiver, respectively.

The mobile communication system may be cellular. The term cell refers to a coverage area of radio services provided by a transmission point, a remote unit, a remote head, a remote radio head, a base station transceiver, relay transceiver or a NodeB, an eNodeB, respectively. The terms cell and base station transceiver may be used synonymously. In some examples a cell may correspond to a sector. For example, sectors can be achieved using sector antennas, which provide a characteristic for covering an angular section around a base station transceiver or remote unit. In some examples, a base station transceiver or remote unit may, for example, operate three or six cells covering sectors of 120° (in case of three cells), 60° (in case of six cells) respectively. Likewise a relay transceiver may establish one or more cells in its coverage area. A mobile transceiver can be registered or associated with at least one cell, i.e. it can be associated to a cell such that data can be exchanged between the network and the mobile in the coverage area of the associated cell using a dedicated channel, link or connection. A mobile transceiver may hence register or be associated with a relay station or base station transceiver directly or indirectly, where an indirect registration or association may be through one or more relay transceivers.

FIG. 1 schematically illustrates an example of an apparatus 100 for amplifying an input signal 101 to generate an output signal 102 via an output stage 110.

The apparatus 100 comprises a compensation signal generator 120. The compensation signal generator 120 generates a compensation signal 140 based on at least one of a voltage value of the input signal 101 and a voltage value of the output signal 102. In some examples, the compensation signal generator 120 may generate the compensation signal 140 based on the voltage value of the input signal 101 only. In some examples, the compensation signal generator 120 may generate the compensation signal 140 based on the voltage value of the output signal 102 only. The compensation signal generator 120 may, in some examples, generate the compensation signal 140 based on a combination of the voltage value of the input signal 101 and the voltage value of the output signal 102.

Figure 2:
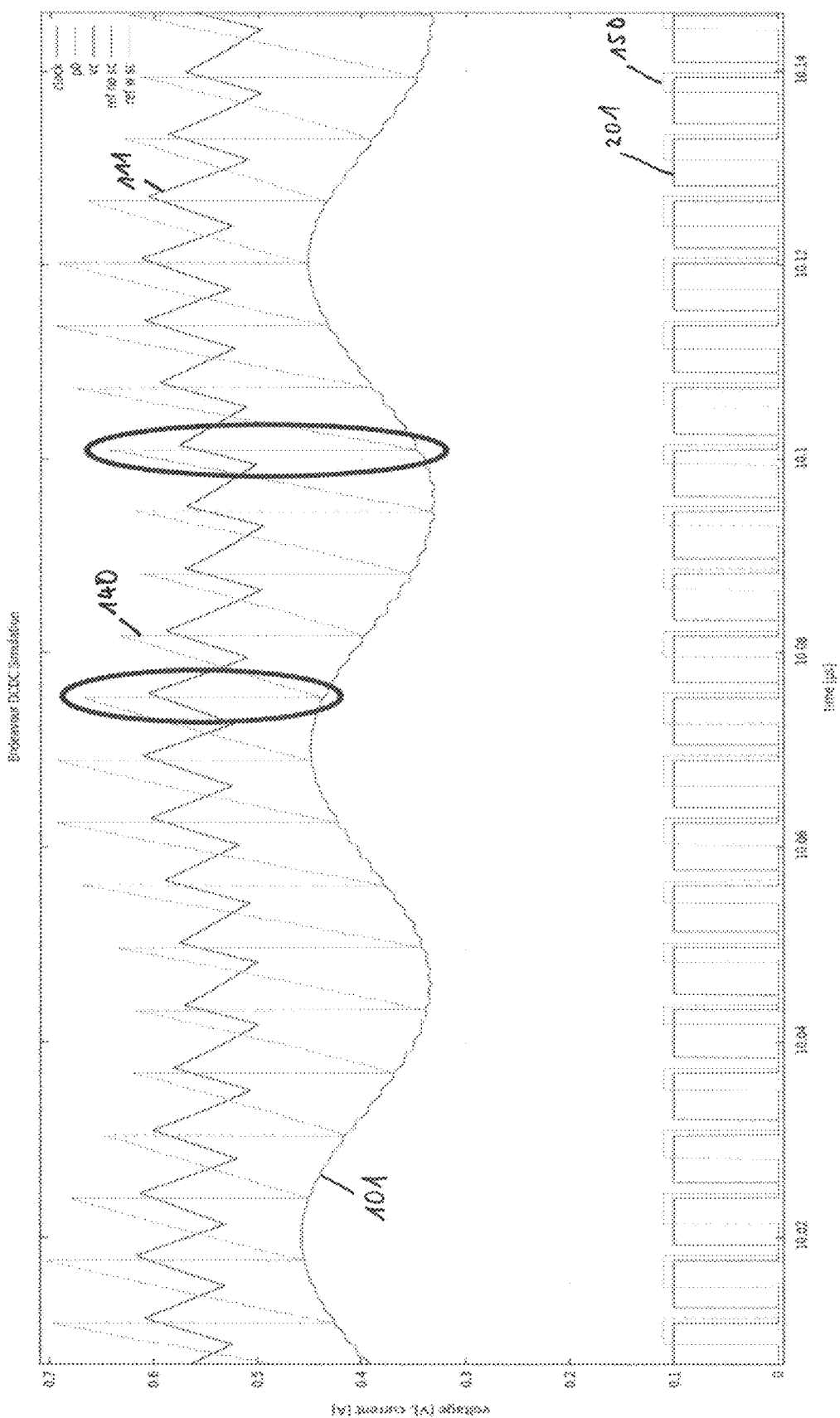
FIG. 2 illustrates an example of a compensation signal, an example of a signal related to a current value of the output stage and an example of a control signal.

The apparatus further comprises a combiner 130. The combiner 130 generates a control signal 150 for the output stage 110. The control signal 150 is based on a target signal 103, the compensation signal 140 and a signal 111 related to a current value of the output stage 110 (examples of the various signals used within the apparatus 100 are illustrated in FIG. 2).

The target signal 103 corresponds to a desired output signal, i.e., the target signal 103 indicates a desired course of the output signal 102 (e.g. a desired output voltage power of the output signal 102). For example, the target signal 103 may be related to a combination of the input signal 101 and the output signal 102 or a combination of the input signal 101 and a signal related to the output signal 102. By combining the input signal 101 with the output signal 102 or the signal related to the output signal 102, specific characteristics of the output stage 110 may be taken into account for the target signal 103. For example, the input signal 101 may be shaped by the output signal 102 or the signal related to the output signal 102 in order to compensate for (distorting) characteristics of the output stage 110.

In some examples, the target signal 103 may be based on a combination of the input signal 101, the signal related to the output signal 102 and a signal related to the control signal 150. By additionally using the signal related to the control signal 150, specific characteristics of the combiner 130 may be taken into account for the target signal 103. For example, the input signal 101 may be shaped by the signal related to the output signal 102 and the signal related to the control signal 150 in order to compensate for (distorting) characteristics of the output stage 110 and the combiner 130.

The signal related to the output signal 102 may be a filtered or shaped copy of the output signal 102, wherein a filter or shaping characteristic may be adjustable. The signal related to the control signal 150 may be a filtered or shaped copy of the control signal 150, wherein a filter or shaping characteristic may be adjustable. The above filter or shaping characteristics may each be adjusted based on characteristics of the actual implementation of the apparatus 100.

The combiner 130 may comprise one or more elements to combine two or more of the target signal 103, the compensation signal 140 and the signal 111 related to a current value of the output stage 110. For example, the combiner may comprise a first element to combine the target signal 103 and the compensation signal 140 in order to generate a combined signal, and a second element to combine the combined signal and the signal 111 related to a current value of the output stage 110. For example, the combiner 130 may comprise one or more comparators to compare two or more of the signals, and/or the combiner 130 may comprise one or more logic gates or latches.

The output stage 110 generates the output signal 102 using the control signal 150. The output stage 110 may, in some examples, be based on a switching mode power supply (e.g. an electronic power supply that incorporates a switching regulator to convert electrical power). The control signal 150 may be generated in order to control the switching mode power supply. In some examples, the output stage 110 may comprise at least an inductor-capacitor network and a capacitive element. The inductor-capacitor network comprises at least an inductive element and a capacitive element (coupled to a reference potential, e.g., ground), which are coupled together. The inductor-capacitor network and the capacitive element of the output stage 110 may generate the output signal 102 based on the control signal 150. The output signal 150 is a full-swing voltage signal. The output signal 150 may have a dynamic range up to several Volts.

The combiner 130 uses the signal 111 related to a current value of the output stage 110 for generating the control signal 150. Accordingly, the output stage 110 is controlled based on its current value. For example, the current value of the output stage 110 may be induced by an inductive element (e.g. a coil or an inductor) of the output stage 110. Hence, the combiner 130 may be considered as a current mode controller for the output stage 110.

In order to avoid control instabilities for a duty cycle above 50% (for peak current mode control of a switching mode power supply) or a duty cycle below 50% (for valley current mode control of a switching mode power supply), the compensation signal 140 is generated to the combiner 130 (acting as current mode controller). In general, a slope compensation signal may be used by a current mode control to adjust a slope of a reference signal (e.g. target signal 103), which is compared to a signal related to a current value of a current mode controlled device (e.g. signal 111), since the reference signal may be distorted (e.g. a magnitude of the reference signal may be too high or too low) for duty cycles above or below 50%. The slope compensation signal may allow to adjust a slope of the reference signal, so that distortions of the reference signal may be at least mitigated (or compensated). The accordingly corrected reference signal may then be compared to the signal related to a current value of the current mode controlled device. The corrected reference signal may allow to avoid incorrect comparison results. Since the current mode controlled device (e.g. an output stage of an amplifier) is controlled based on the comparison result, the provision of an incorrect output signal by the current mode controlled device may be avoided. Contrary to a conventional slope compensation signal, the compensation signal 140 of the example of FIG. 1 is based on the input signal 101 and/or the output signal 102. Hence, signal characteristics of the input signal 101 and/or the output signal 102 may be taken into account for the compensation signal 140. For example, a magnitude of the compensation signal may be adjusted based on the input signal 101 and/or the output signal 102. Hence, an amount of slope correction applied to the target signal 103 may be adjusted based on instantaneous characteristics the input signal 101 and/or the output signal 102.

The dependency of the compensation signal 140 on the input signal 101 and/or the output signal 102 may allow to control the output stage 110 such that a disturbance of the output signal 102 is avoided. In particular, a transfer function of the combiner 130 may be independent of a power level of the input signal 101. Accordingly, the output stage 110, which generates a full-swing output signal, may be current mode controlled by the combiner 130. A linearity and a frequency response of the apparatus 100 may be enhanced compared to conventional current mode controlled amplification circuits.

For example, the compensation signal generator 120 may generate a single compensation signal 140 for a working cycle of the apparatus 100. The working cycle of the apparatus may be, e.g., a control cycle for controlling the output stage 110 to generate an output signal. For example, the working cycle may be a switching cycle for an output stage 110 which is based on a switching mode power supply. In order to avoid disturbance of the output signal 102 generated by the output stage 110 during the working cycle (e.g. the switching cycle), the single compensation signal 140 may be used by the comparator to generate the control signal 150. In particular, for a duty cycle above or below 50% (e.g. the control signal 150 is active for more or for less than half of the working cycle), the dependency of the compensation signal 140 on the input signal 101 and/or the output signal 102 may allow to compensate for current mode control related disturbance of the output signal 102.

Alternatively, the compensation signal generator 120 may generate multiple compensation signals 140 within the working cycle of the apparatus 100. Generating multiple compensation signals 140 within the working cycle may comprise generating two or more, five or more, ten or more, or 50 or more compensation signals 140 within the working cycle of the apparatus 100. Generating multiple compensations signals 140 within the working cycle (e.g. a continuously updated compensation signal) may improve a high frequency performance of the apparatus 100. For example, multiple compensations signals 140 within the working cycle may be used for a high frequency output signal 102.

In some examples, the compensation signal generator 120 may generate multiple compensation signals 140 for a first working cycle of the apparatus 100 and generate a single compensation signal 140 for a second working cycle of the apparatus 100. Changing the mode of compensation signal provision for different working cycles may allow to adapt the compensation signal provision to an operating mode of the apparatus 100. For example, a single compensation signal per working cycle may be used for an output signal having a lower frequency and multiple compensation signals per working cycle may be used for an output signal having a higher frequency.

The apparatus 100 may comprise one or more additional optional features corresponding to one or more aspects of the proposed concept or one or more examples described below.

Generally speaking, some examples relate to a means for amplifying an input signal to provide an output signal via a means for providing an output signal. The means for amplifying comprises a means for generating a compensation signal based on at least one of a voltage value of the input signal and a voltage value of the output signal. Further, the means for amplifying comprises a means for generating a control signal for the means for generating an output signal based on a target signal, the compensation signal and a signal related to a current value of the means for generating an output signal. The target signal corresponds to a desired output signal. The means for generating an output signal is configured to generate the output signal based on the control signal. The means for amplifying may be implemented an apparatus for amplifying an input signal described above or below (e.g. FIG. 1). The means for generating an output signal may be implemented by an output stage described above or below (e.g. FIG. 1). The means for generating a compensation signal may be implemented by a compensation signal generator described above or below (e.g. FIG. 1). The means for generating a control signal may be implemented by a combiner described above or below (e.g. FIG. 1).

FIG. 2 illustrates an example of a temporal course of a compensation signal 140 in a timing diagram. The abscissa of the timing diagram denotes time and the ordinate denotes a magnitude of a current value or a voltage value of signal illustrated in the timing diagram.

For example, the compensation signal generator 120 of apparatus 100 illustrated in FIG. 1 may provide the compensation signal 140 illustrated in FIG. 2. The compensation signal 140 may have a triangular signal shape.

Further, FIG. 2 illustrates an example of an input signal 101. The input signal 101 may have a full-swing wave characteristic as illustrated in FIG. 2. For example, the input signal 101 may be substantially a sine wave. The input signal 101 shall, e.g., be amplified by a switching mode power supply. To this end, the control signal 150 is generated by the circuit illustrated in FIG. 1, the control signal 150 varying the duty cycle of the switching mode power supply to reproduce the waveform of the input signal.

It can be seen that a magnitude of the envelope of the compensation signal 140 may vary with time. In particular, it can be seen that a course of the magnitude of the compensation signal's envelope may be similar to a course of the input signal 101. For example, the compensation signal 140 may be modulated with the input signal 101. In some examples, the compensation signal generator 120 of apparatus 100 illustrated in FIG. 1 may adjust an amplitude of the compensation signal 140 based on at least one of the voltage value of the input signal 101 and the voltage value of the output signal 102.

FIG. 2 further illustrates an example of a signal 111 related to a current value of the output stage 110. As can be seen from FIG. 2, the signal 111 may have a triangular signal shape. Further, a magnitude of the envelope of the signal 111 related to a current value of the output stage 110 may vary with time. For example, a course of the magnitude of the envelope of the signal 111 related to a current value of the output stage may be similar to the course of the input signal 101.

An example of a control signal 150 is further illustrated in FIG. 2. For example, the control signal 150 may be derived by combining the compensation signal 140 and the input signal 101 (e.g. target signal 103 may correspond to input signal 101), and comparing the combined signal with the signal 111 related to a current value of the output stage 110. For example, the control signal 150 may indicate a logic high level if the magnitude of the combined signal is greater than the magnitude of the signal 111 related to a current value of the output stage 110. For example, the control signal 150 may indicate a logic low level if the magnitude of the combined signal is smaller than the magnitude of the signal 111 related to a current value of the output stage 110. The amplifier 110 of the apparatus 100 illustrated in FIG. 1 may, e.g., be controlled based on the control signal 150 illustrated in FIG. 2.

Further, FIG. 2 illustrates an example of a clock signal 201. For example, the clock signal 201 may represent a switching clock of an output stage 110 being based on a switching-mode power supply of the apparatus 100 illustrated in FIG. 1, the switching clock may determine a working cycle of the output stage 110.

In other words, FIG. 2 may show how some examples of an adaptive slope compensation are working. The curve 101 may be the input signal, the signal 140 may the slope compensation signal ($V_{se}$), the signal 111 may be the current feedback signal from a current mode driver stage (e.g. combiner 130). The curve 201 may be a clock and the curve 150 may be the digital output signal of the driver (e.g. combiner 130). It can be seen that the value of the slope compensation signal may be modulated with the height of the input signal. In general, the slope control signal may be modulated by the output signal and/or by the input signal.

Figure 3:
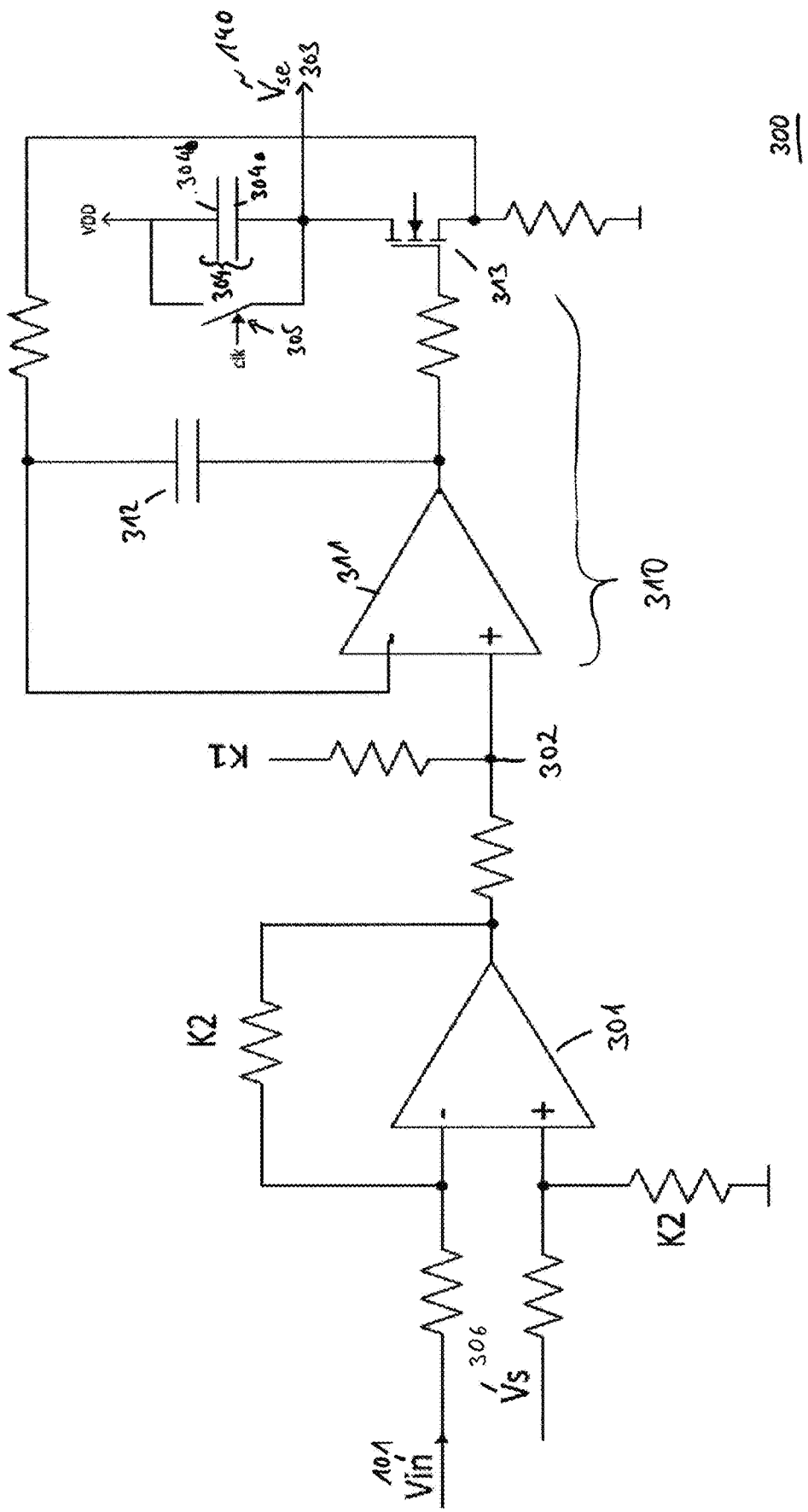
FIG. 3 illustrates an example of a compensation signal generator.

FIG. 3 illustrates an example of a compensation signal generator 300. The compensation signal generator 300 comprises a difference amplifier 301 (e.g. an analog difference amplifier). The voltage value of the input signal 101 (Vin) and/or the voltage of the output signal 102 (e.g. as provided by the output stage 110 illustrated in FIG. 1) is provided to one port of the difference amplifier 301, whereas a supply voltage 306 of the apparatus (e.g. a voltage value of a power supply signal $V_s$ for apparatus 100 illustrated in FIG. 1) is provided to the other port of the difference amplifier 301. The difference amplifier 301 generates a voltage difference signal by modifying a difference between the supply voltage 306 of the apparatus 100 and at least one of the voltage value of the input signal 101 and the voltage value of the output signal 102 by a gain factor K2. The difference amplifier 301 supplies the voltage difference signal to a first node 302. The first node 302 is coupled to a first potential K1.

The compensation signal generator 300 further comprises a capacitive element 304 comprising a first electrode 304a coupled to an output node 303 of the compensation signal generator 120 and a second electrode 304b coupled to a second potential VDD.

Further, the compensation signal generator 300 comprises a voltage-to-current converter 310 comprising an input coupled to the first node 302 and an output coupled to the output node 303. The voltage-to-current converter 310 comprises an operational amplifier 311 and a second capacitive element 312. The voltage-to-current converter 310 charges the first electrode 304a based on a voltage provided by the first node 302 (e.g. via field effect transistor 313).

The compensation signal generator 300 short-cuts the output node 303 and the second electrode 304b of the capacitive element 304. For example, the example 120 may periodically open or close a switch 305 to short cut the output node 303 and the second electrode 304b. In some examples, an opening or closing frequency of the switch 305 may be based on a switching clock of the output stage 110 (e.g. clock signal 201 illustrated in FIG. 2).

The compensation signal generator 300 provides a compensation signal 140 ($V_{se}$) at the output node 303. For example, the compensation signal 140 may have a signal shape as illustrated in FIG. 2.

In other words, FIG. 3 may show an implementation of the adaptive slope compensation. On the left hand the input voltage may be fed into an analog difference amplifier. The constant voltages Vs and K1 and the gain K2 may be related to an adaptive slope compensation equation, which may describe a relation (e.g. a linear relation) between the compensation signal, the supply voltage of the circuit and the input signal (e.g. below equation (1)). The second operational amplifier circuit may be a voltage-to-current converter and may, e.g., convert the voltage into a triangular slope compensation voltage by charging the output capacitor that may be reset periodically with the switching clock.

The compensation signal generator 300 may comprise one or more additional optional features corresponding to one or more aspects of the proposed concept or one or more examples described above or below.

Figure 4:
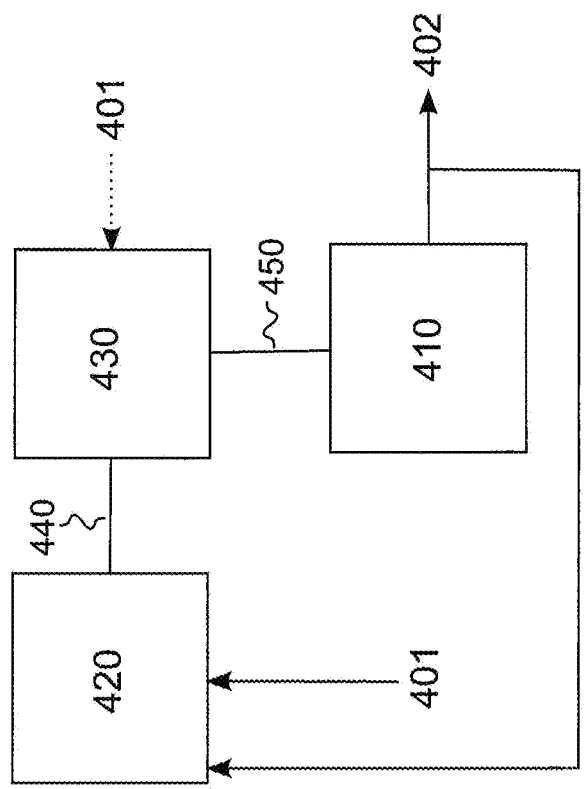
FIG. 4 illustrates an example of an amplification circuit.

FIG. 4 illustrates an example of a current mode controlled amplification circuit 400. The amplification circuit 400 comprises an amplifier 410. The amplifier 410 provides an output signal 402.

The amplifier 410 is controlled by a current mode controlled driver 430. The current mode controlled driver 430 provides a control signal 450 to the amplifier 410 for controlling the amplifier 410.

The current mode controlled driver 430 provides the control signal 450 based on an input signal 401 and a slope compensation signal 440. The slope compensation signal 440 is provided by slope compensation signal generator 420. The slope compensation signal generator 420 generates the slope compensation signal 440 for the current mode controlled driver 430 based on at least one of a voltage value of an input signal 401 for the amplifier 410 or a voltage value of an output signal 402 provided by the amplifier 410.

In some examples, the slope compensation signal generator 420 may provide the compensation signal 440 based on the voltage value of the input signal 401. In some examples, the slope compensation signal generator 420 may provide the compensation signal 440 based on the voltage value of the output signal 402. The slope compensation signal generator 420 may, in some examples, provide the compensation signal 440 based on a combination of the voltage value of the input signal 401 and the voltage value of the output signal 402.

In order to avoid control instabilities for a duty cycle above 50% (for peak current mode control) or a duty cycle below 50% (for valley current mode control), the slope compensation signal 440 is provided to the current mode controlled driver 430. Contrary to conventional slope compensation approaches, the slope compensation signal 440 is based on the input signal 401 and/or the output signal 402. Hence, signal characteristics of the input signal 401 and/or the output signal 402 may be taken into account for the slope compensation signal 440. For example, a magnitude of the slope compensation signal may be adjusted based on the input signal 401 and/or the output signal 402. Hence, an amount of slope correction applied to the input signal 401 by the current mode controlled driver 430 may be adjusted based on instantaneous characteristics the input signal 401 and/or the output signal 402.

The dependency of the slope compensation signal 440 on the input signal 401 and/or the output signal 402 may allow to control the amplifier 410 such that a disturbance of the output signal 402 is avoided. In particular, a transfer function of the current mode controlled driver 430 may be independent from a power level of the input signal 401. Accordingly, the amplifier 410, which provides a full-swing output signal, may be current mode controlled by the current mode controlled driver 430. A linearity and a frequency response of the circuit 400 may be enhanced compared to amplification circuits according to the state of the art.

In other words, the current mode controlled driver may have the advantages of higher speed at lower delay in the driver and no pulse-width modulation delay compared to a classical pulse-width modulator. A feedback stability may thus be improved and higher feedback loop bandwidths may be possible. The slope control signal for the current mode controlled driver may, e.g., be modulated by the output signal and/or by the input signal. Due to this modulation, the transfer function of the current mode control driver may be constant for all input amplitudes. Because of this input level independent transfer function, distortions in the output signal may be avoided. It may thus be possible to use current mode control also in full-swing output stages (e.g. for amplifier 410).

In some examples, the slope compensation signal generator 420 may generate a single slope compensation signal 440 for a working cycle of the current mode controlled driver 430. The working cycle of the current mode controlled driver 430 may be, e.g., a control cycle for controlling the amplifier 410 to provide an output signal. For example, the working cycle may be a switching cycle for an amplifier 410 which is based on a switching mode power supply. In order to avoid disturbance of the output signal 402 provided by the amplifier 410 during the working cycle (e.g. the switching cycle), the single slope compensation signal 440 may be used by the current mode controlled driver 430 to provide the control signal 450. In particular, for a duty cycle above or below 50% (e.g. the control signal 450 is active for more or for less than half of the working cycle), the dependency of the slope compensation signal 440 on the input signal 401 and/or the output signal 402 may allow to compensate for current mode control related disturbance of the output signal 402.

Alternatively, the slope compensation signal generator 420 may generate multiple slope compensation signals 440 within the working cycle of the current mode controlled driver 430. Generating multiple compensation signals 440 within the working cycle may comprise generating two or more, five or more, ten or more, or 50 or more compensation signals 440 within the working cycle of the current mode controlled driver 430. Generating multiple compensations signals 440 within the working cycle (e.g. a continuously updated compensation signal) may improve a high frequency performance of the amplifier 410.

In other words, a slope compensation generator (e.g. slope compensation signal generator 420) of a current mode control may be restarted every period in a sampled driver stage (e.g. current mode controlled driver 430) for an amplifier. Hence, an updated voltage value of an input signal (and/or a voltage value of an output signal) for the amplifier may be provided to the slope compensation generator. For a high speed amplifier, a high frequency performance may be improved if a continuous update of a slope compensation during a running switching period (e.g. a working cycle of the apparatus) is performed. The output voltage of the output stage may be one option as control input for the slope compensation generator. However, the output voltage may be delayed between the driver input and the amplifier output due to driver delay and output filter delay. Therefore, the input voltage may be favorable for the adaptive slope compensation. Feedback loops of the amplifier may ensure that the input voltage magnitude is the same as the output voltage magnitude. Therefore the input voltage may provide the same information but without delay. In general, for the implementation of the adaptive slope compensation there are different options: feed back of output voltage, feed forward of input voltage, periodic update or continuous update. The above options may be combined in different permutations. Some examples may use the input voltage with continuous update.

The slope compensation signal generator 420 may comprise one or more additional optional features corresponding to one or more aspects of the proposed concept or one or more examples described above or below. In particular, the slope compensation signal generator may comprise examples similar to the example 120 of a compensation signal generator illustrated in FIG. 3.

Generally speaking, some examples relate to a means for a current mode controlled driver of an amplifier. The means is configured to generate a slope compensation signal for the current mode controlled driver based on at least one of a voltage value of an input signal for the amplifier or a voltage value of an output signal provided by the amplifier. The means may be implemented by a slope compensation signal generator described above or below (e.g. FIG. 4).

Figure 5:
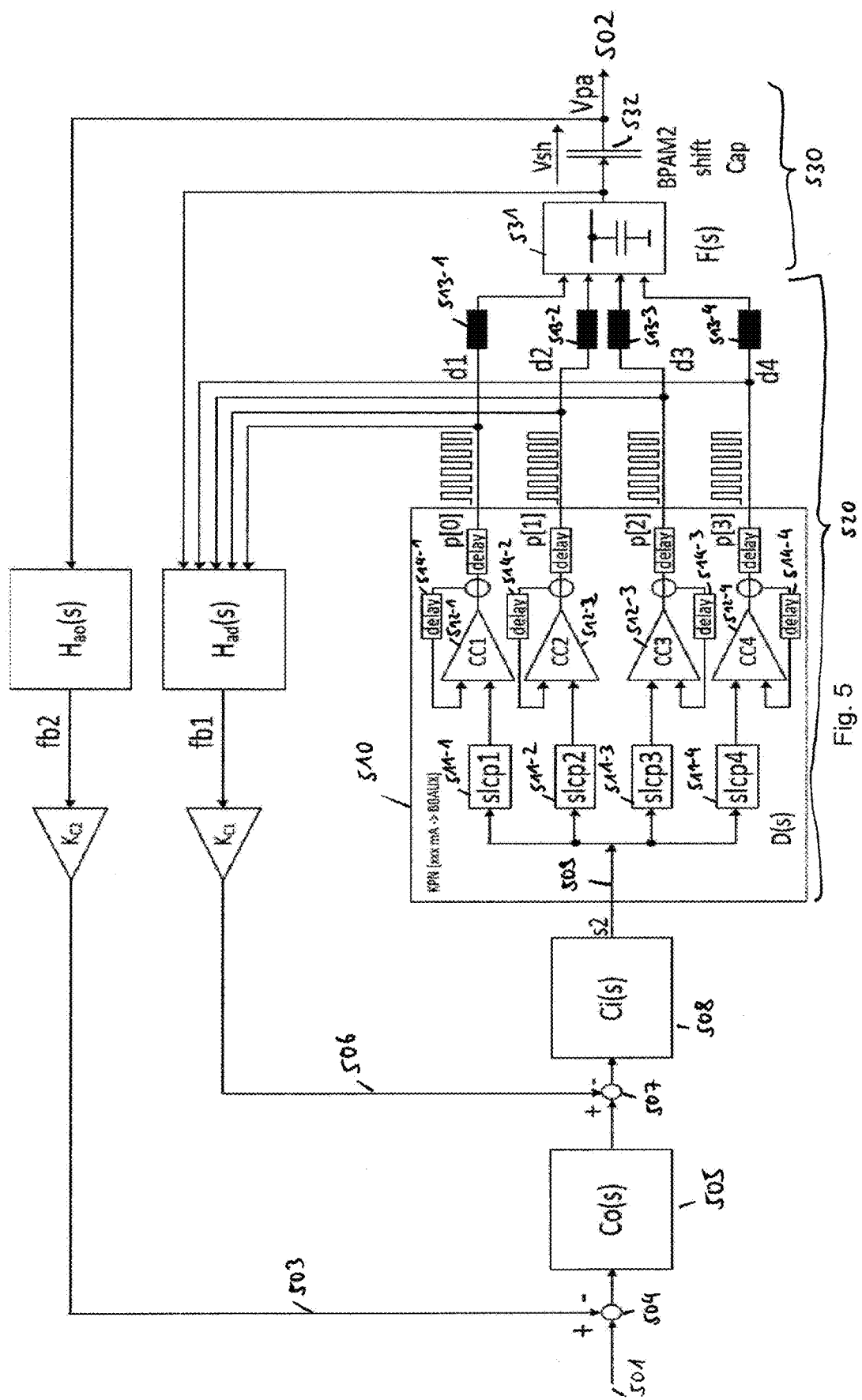
FIG. 5 illustrates another example of an amplification circuit.

An example of a four phase controlled amplification circuit 500 is illustrated in FIG. 5. The amplification circuit 500 provides an output signal 502 ($V_{pa}$) based on an input signal 501. The output signal 502 is the amplified input signal 501.

The input signal 501 is combined with a first feedback signal 503 in a first combiner 504. For example, the first combiner 504 may be an adder. The first feedback signal may be related to the output signal 502 of the amplification circuit 500 (e.g. a voltage signal related to a voltage of the output signal 502). The combined signal is provided to a first control block 505. The first control block 505 may modify the combined signal.

The modified combined signal is combined with a second feedback signal 506 in a second combiner 507. For example the second combiner 507 may be an adder. The second feedback signal 506 may be related to a control signal for an output stage 530 of the amplification circuit 500 (e.g. a voltage signal related to a voltage of the control signal). The again combined signal is provided to a second control block 508. The second control block may modify the signal to provide a target signal 509 (s2). The target signal may indicate or correspond to a desired output signal of the amplification circuit 500.

The target signal 509 is provided to a modulator 510 (D(s)). The modulator 510 is part of a current mode control for the output stage 530 of the amplification circuit 500. The modulator 510 comprises four slope compensation unit 511-1, . . . , 511-4 (slcp 1 . . . 4), four current comparators 512-1, . . . , 512-4 (CC1 . . . 4) and four output power drivers (e.g. push-pull switches d1 . . . 4). That is, in the example illustrated in FIG. 5, the amplifier circuit 500 uses 4 phases.

In the slope compensation units 511-1, . . . , 511-4, the target signal 509 is combined with a respective slope compensation signal depending on the input signal 501 and/or the output signal 502. A respective slope compensated signal is provided by the slope compensation units 511-1, . . . , 511-4.

The slope compensated signal is, for each phase component, provided to the respective current comparator 512-1, . . . , 512-4. The respective current comparator 512-1, . . . , 512-4 compares the slope compensated signal with a signal related to a current value of the respective output inductor 513-1, . . . , 513-4. The output power driver is contained in the respective current comparator 512-1, . . . , 512-4 and generates a digital pulse width modulated signal. The driver output currents flow through the inductors 513-1, . . . , 513-4, and the four currents are added at a output capacitor 531. Delay blocks 514-1 . . . 514-4 are illustrated in FIG. 5 to indicate a measurement delay and a delay in the current comparators 512-1 . . . 512-4. The 4 phases may operate with a 90° phase shift due to a corresponding shift in the single phase clock signals.

That is, each phase may be synchronized to a different phase shifted clock.

For example, the first feedback signal 503 may be provided by shaping the output signal 502 with a transfer function $H_{ao}(s)$ and amplifying the resultant shaped function with a gain $K_{c2}$. Accordingly, the output of the amplifier circuit 500 is fed back as first feedback signal 503.

For example, the second feedback signal 506 may be provided by combining and shaping the control signals of the output power drivers and the further control signal for the capacitive element 532 with a transfer function $H_{ad}(s)$ and amplifying the resultant shaped function with a gain $K_{c1}$. Accordingly, the digital output signals for the output power drivers are fed back as second feedback signal 506.

The example of an amplification circuit 500 may use peak current control or valley current control. For example the output power drivers may be controlled based on their respective peak current values (e.g. highest magnitude of the current during a defined working cycle) or their respective valley current values (e.g. lowest magnitude of the current during the defined working cycle). Alternatively, average current control may be used, i.e., the output power drivers may be controlled based on an average value of their respective current. For example, the current value of the output power drivers may be related to the inductive elements 513-1, . . . , 513-4 (e.g. a coil or an inductor) of the output power drivers.

Since slope compensation units 511-1, . . . , 511-4 combine the target signal 509 with a respective slope compensation signal depending on the input signal 501 and/or the output signal 502, signal characteristics of the input signal 501 and/or the output signal 502 may be taken into account for the respective slope compensation signal. For example, a magnitude of the respective slope compensation signal may be adjusted based on the input signal 501 and/or the output signal 502. Hence, an amount of slope correction applied to the target signal 509 by the slope compensation units 511-1, . . . , 511-4 may be adjusted based on instantaneous characteristics the input signal 501 and/or the output signal 502. Hence, the current mode control of the output stage 530 of the amplification circuit 500 may be independent from a power level of the input signal 501. Accordingly, the current mode control 520 may have a constant transfer function, so that current mode control related disturbances of the output signal 502 may be avoided. Therefore, current mode control of the full-swing output stage 530 may be possible.

The example illustrated in FIG. 5 comprises a modulator for four phases with four output inductors. Alternatively, other suitable numbers of phases may be used. For example, two phases having a phase difference of 180°, three phases having a phase difference of 120°, or six phases having a phase difference of 60° may be used. Accordingly, the number slope compensation units, current comparators, and output power drivers may be adapted to the number of phases.

For example, FIG. 5 may show a block figure of a digital power amplifier with a four phase current mode control block. An input signal (on the left) may be fed through two control blocks (inner loop and outer loop) and a remaining error signal may go into the modulator block D(s). The modulator block may consist of four slope compensation units (slcp1 . . . slcp4), four current comparators (CC1 . . . CC4) with four output power drivers (push-pull switches). The output signals may be 4-digital signals that are fed into an LC output filter.

There may be two feedback loops. The inner loop may feed back the digital output signals via a transfer function $H_{ad}(s)$ and gain KC1. The outer loop may feed back the amplifier output signal via a transfer function $H_{ao}(s)$ and gain KC2. The example may use valley current control but may also be used for peak current control and average current control.

The amplification circuit 500 may comprise one or more additional optional features corresponding to one or more aspects of the proposed concept or one or more examples described above or below.

Figure 6:
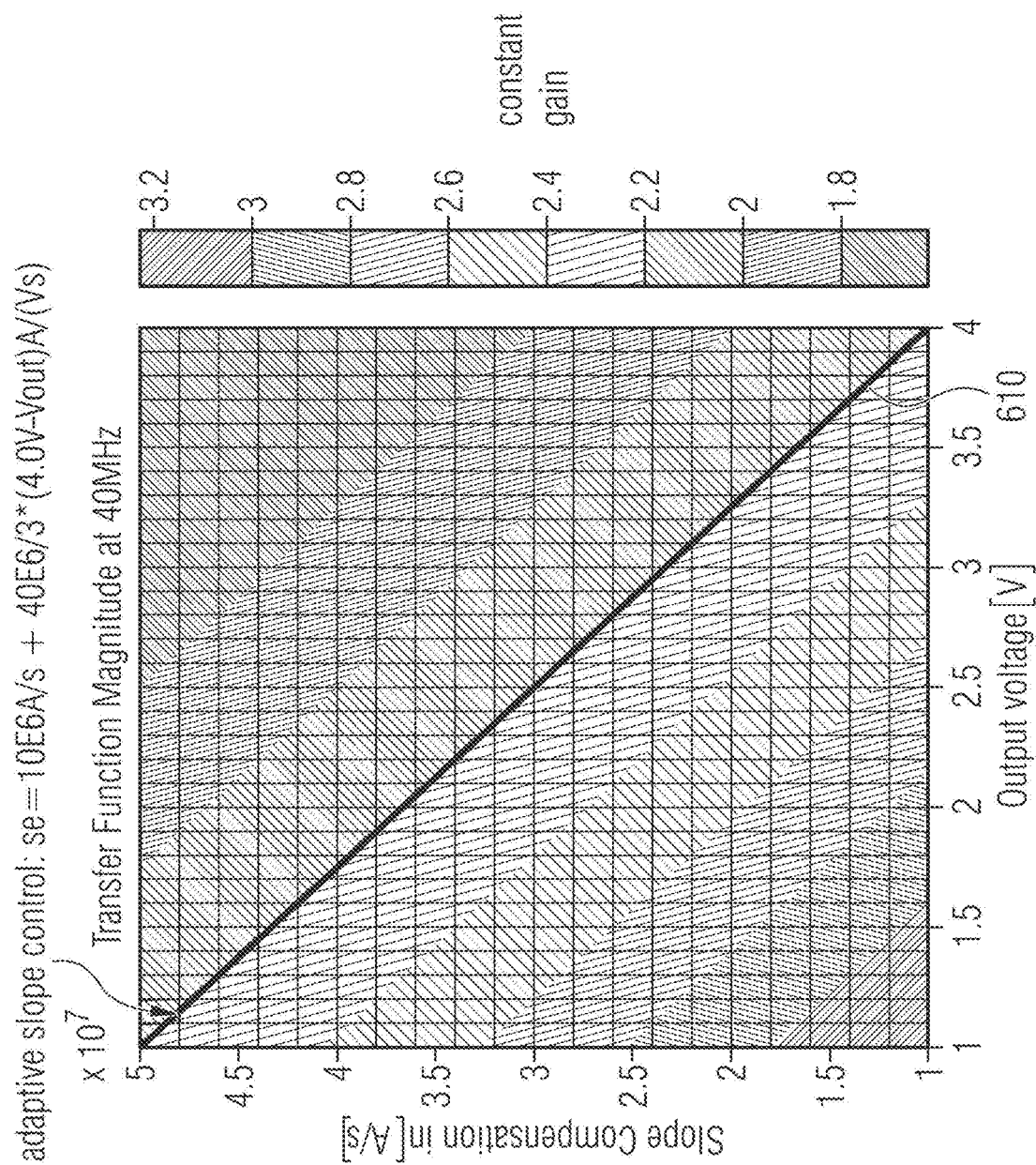
FIG. 6 illustrates an example of a relation between a gain of a current mode controller, a voltage value of an output signal of an amplifier controlled by the current mode controller, and a value of the compensation signal.

FIG. 6 illustrates an example of a relation between a gain of a current mode controller, a voltage value of an output signal of an amplifier controlled by the current mode controller, and a value of the (slope) compensation signal for the current mode controller.

The gain of a current mode controller (e.g. its transfer characteristic) should be independent of the power of the input signal and the power level of the output signal. The abscissa of FIG. 6 denotes the output voltage of an amplifier controlled by the current mode controller in Volt (V). The ordinate denotes the slope compensation for the current mode controller in Ampere per second (A/s). FIG. 6 illustrates a gray-scale level diagram, wherein a same gray level denotes a constant gain of the current mode controller (e.g. a constant transfer characteristic of the current mode controller).

In order to achieve a constant gain for the full output voltage range, a straight line may be fitted to determine a (slope) compensation signal for the current mode controller that depends linear on at least one of the voltage value of the input signal and the voltage value of the output signal. For example, the (slope) compensation signal may be determined according to $$S_{comp} = k_1 + k_2 * (V_s - V_{i/o}) \quad (1)$$

with $S_{comp}$ denoting the compensation signal (se), $k_1$ and $k_2$ denoting constants, V denoting a supply voltage of the apparatus and $V_{i/o}$ denoting the voltage value of the input signal, the voltage value of the output signal or a combination thereof.

In the example illustrated in FIG. 6, $k_1 = 10^6$ A/s and $k_2 = 40/3 * 10^6$ A/s may be determined for a supply voltage $V_s = 4.0V$. The line 610 may represent a trajectory providing a constant transfer function of the current mode controller.

For example, the compensation signal generator 120 of the apparatus 100 illustrated in FIG. 1 may provide the compensation signal 140 such that it depends linearly on at least one of the voltage value of the input signal 101 and the voltage value of the output signal 102. In particular, the compensation signal generator 120 may provide the compensation signal 140 according to an operation which is mathematically correspondent to above equation (1).

For example, slope compensation signal generator 420 of the amplification circuit 40 may adjust an amplitude of the slope compensation signal 440 based on at least one of the voltage value of the input signal 401 and the voltage value of the output signal 402. In particular, the slope compensation signal generator 420 may provide the slope compensation signal 440 according to an operation which is mathematically correspondent to above equation (1).

Figure 7A:
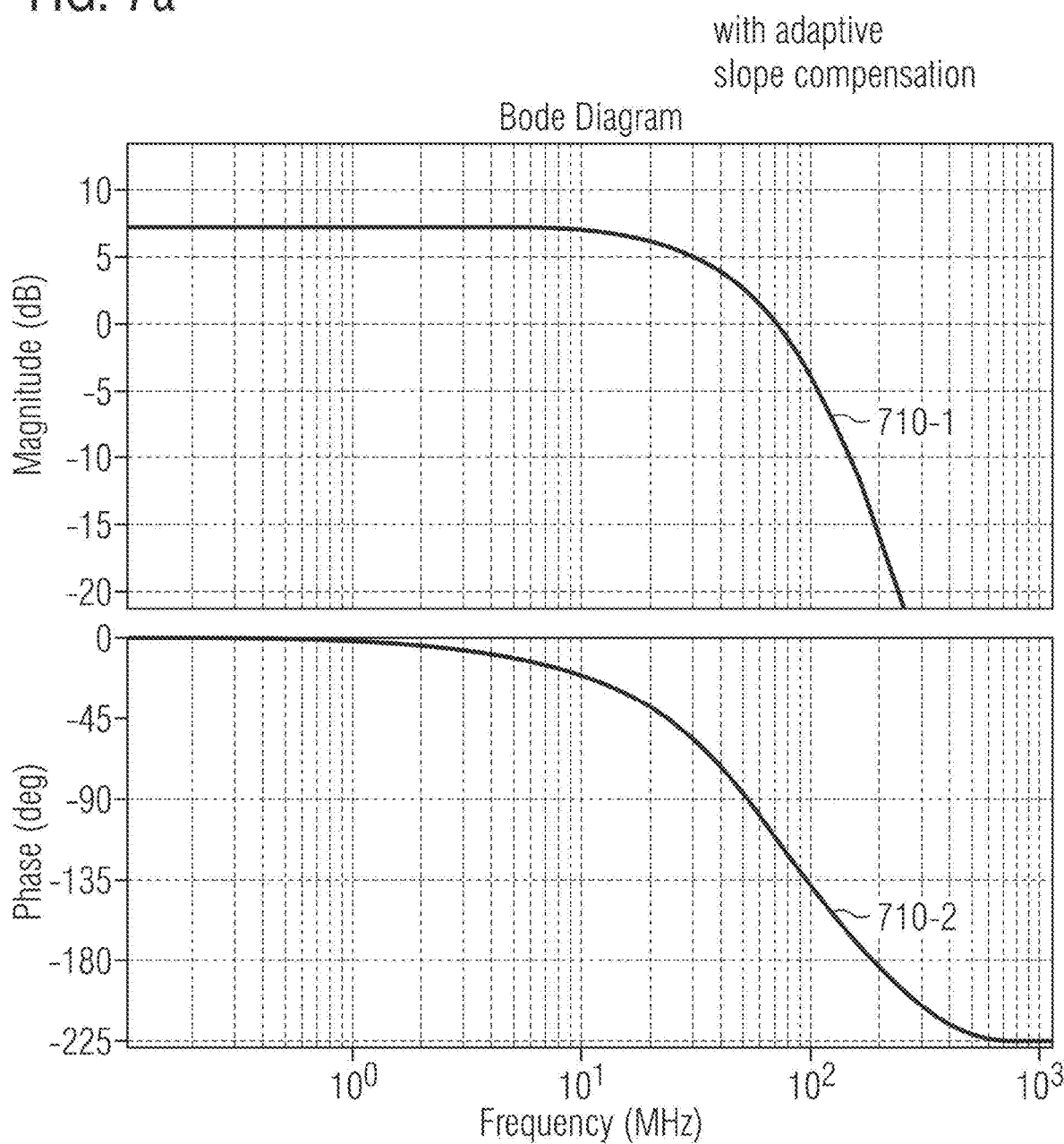
FIG. 7*a* illustrates an example of a transfer function of an example of a current mode controller.

An example of a transfer function of a current mode controller according to one or more aspects of the proposed concept or one or more examples described above is illustrated in FIG. 7a. FIG. 7a illustrates by way of a Bode diagram the frequency response of a current mode controller according to one or more aspects of the proposed concept or one or more examples described above. The upper part of FIG. 7a illustrates the magnitude of the frequency response, whereas the lower part of FIG. 7a illustrates the phase of the frequency response. FIG. 7a illustrates the frequency response for various voltage levels of the output voltage of the amplifier controlled by the current mode controller.

It is evident from FIG. 7a that the transfer function of a current mode controller according to one or more aspects of the proposed concept or one or more examples described above may be constant for different voltage levels of the output voltage of the amplifier controlled by the current mode controller. Both the transfer function of the magnitude 710-1 and the transfer function of the phase 710-2 are constant for varying voltage levels of the output signal at a given frequency of the output signal.

In other words, FIG. 7a may show an example of the impact of the adaptive slope compensation on the transfer function of a current mode driver stage. Using adaptive slope control may generate a single transfer function independent of the output voltage level.

As a reference, FIG. 7b illustrates an example of a transfer function of a conventional current mode controller. FIG. 7b illustrates the Bode diagram for a conventional current mode controller. FIG. 7b illustrates the frequency response for various voltage levels of the output voltage of an amplifier controlled by the conventional current mode controller.

It is evident from FIG. 7b that the transfer function of the conventional current mode controller varies for different voltage levels of the output voltage of the amplifier controlled by the current mode controller. Both the transfer function of the magnitude 720-1 and the transfer function of the phase 720-2 vary for different voltage levels of the output signal.

Figure 8:
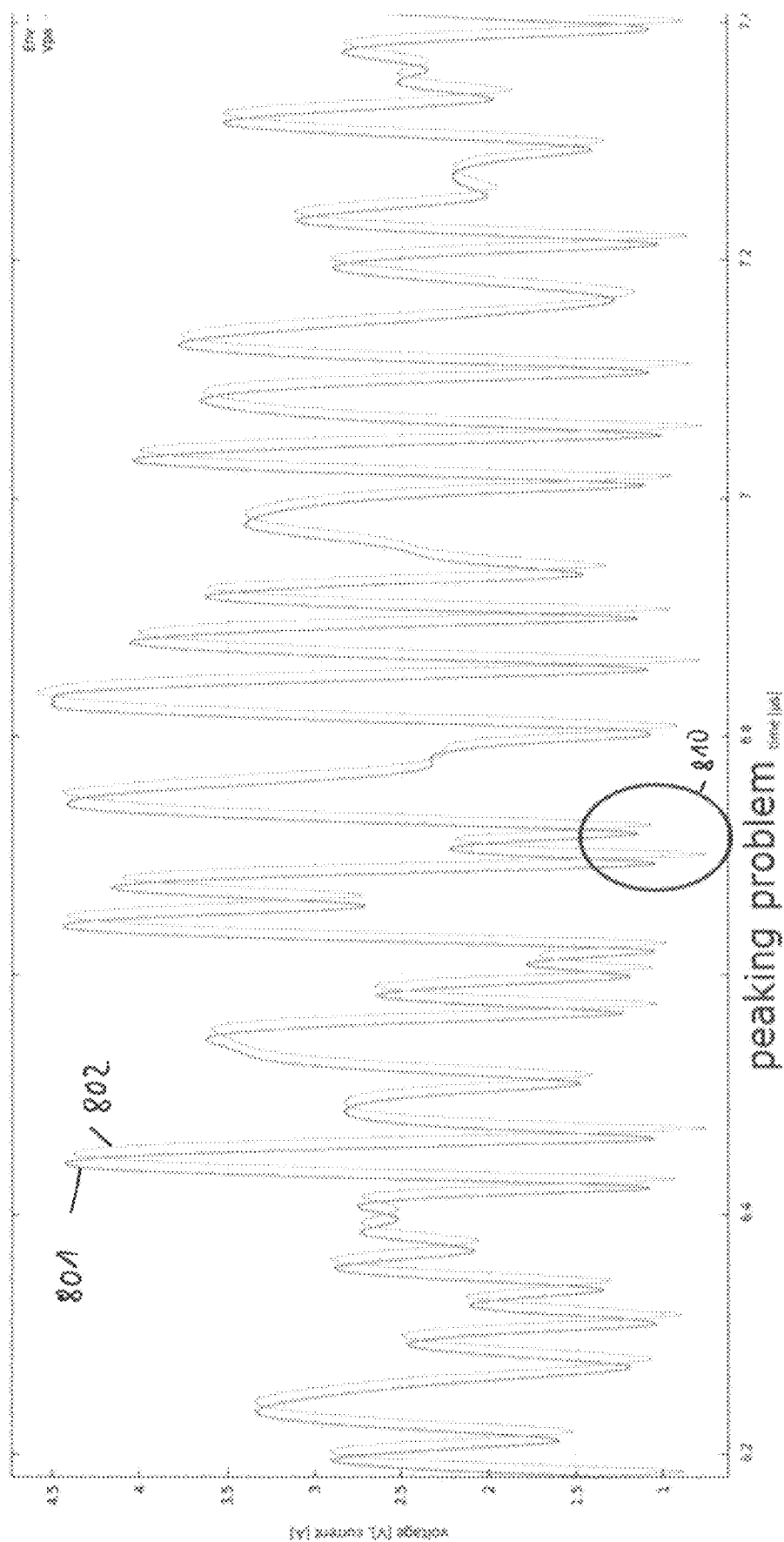
FIG. 8 illustrates a relation between an input signal and an output signal of a current mode controlled amplifier according to the state of the art.

An example of a specific impact of the varying transfer function of a current mode controller according to the state of the art on the operation of an amplifier is illustrated in FIG. 8. FIG. 8 illustrates a relation between an input signal 801 and an output signal 802 of a conventional current mode controlled amplifier. The abscissa of FIG. 8 denotes time and the ordinate denotes a magnitude of a voltage value of a signal illustrated in the timing diagram.

Input signal 801 leads output signal 802 in the time domain. It is evident from FIG. 8 that the amplitude of input signal 801 and output signal 802 are substantially equal for high signal amplitudes (e.g. above 2.5 V in FIG. 8). However, for low signal amplitudes, the amplitudes of input signal 801 and output signal 802 substantially differ (e.g. the amplitudes highlighted by marking 810). FIG. 8 illustrates a situation where the current mode controller is optimized for high signal amplitudes. On the contrary, in a situation where the current mode controller is optimized for low signal amplitudes, the magnitude of input signal 801 and output signal 802 substantially differ for high signal amplitudes. A conventional current mode controller may either be optimized for low signal amplitudes or for high signal amplitudes. Hence, a full-swing output signal of the amplifier will either comprise disturbances for high output signal amplitudes or for low output signal amplitudes. Therefore, an amplifier controlled by a conventional current mode controller is not able to properly reproduce an input signal.

The above disturbances may be avoided using a current mode control according to one or more aspects of the proposed concept or one or more examples described above. Since the (slope) compensation signal for the current mode control is provided based on at least one of the input signal and the output signal, a transfer characteristic of the current mode control is constant for varying power levels of the output signal at a given frequency. Accordingly, an amplifier controlled by a current mode controller according to one or more aspects of the proposed concept or one or more examples described above may properly reproduce low and high signal amplitudes of an input signal.

In some examples, the compensation signal generator 120 of the apparatus 100 illustrated in FIG. 1 may thus provide the compensation signal 140 such that a gain of the output signal 102 compared to the input signal 101 is independent from the power of the output signal 102.

In some examples, the slope compensation signal generator 420 of the circuit 400 illustrated in FIG. 4 may thus provide the slope compensation signal 440 such that a signal gain of the amplifier 410 is independent from a power of the output signal 402.

Accordingly, apparatus 100 illustrated in FIG. 1 and the amplification circuit 400 illustrated in FIG. 4 may properly reproduce high and low signal amplitudes of an input signal. Hence, the apparatus 100 and the amplification circuit 400 may allow efficient current mode control of an output stage of an amplifier.

Figure 9:
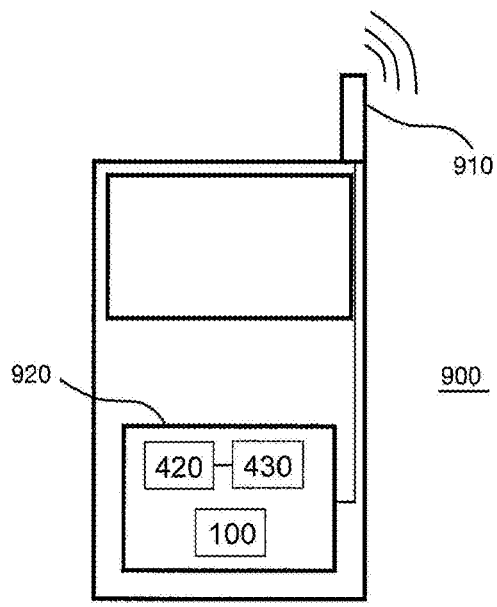
FIG. 9 illustrates an example of a mobile communications device comprising an apparatus for amplifying an input signal and/or a slope compensation signal generator.

FIG. 9 schematically illustrates an example of a mobile communications device or mobile phone or user equipment 900 comprising an apparatus 100 for amplifying an input signal according to an example described herein and/or a slope compensation signal generator 420 for a current mode controlled driver 430 of an amplifier according to an example described herein. The apparatus 100 and/or the slope compensation signal generator 420 may be comprised in a transmitter 920. An antenna element 910 of the mobile communications device 800 may be coupled to the transmitter 920 to radiate a signal into the environment and to wirelessly transmit the signal. To this end, mobile communications devices may be provided having current mode controlled amplification stages.

Figure 10:
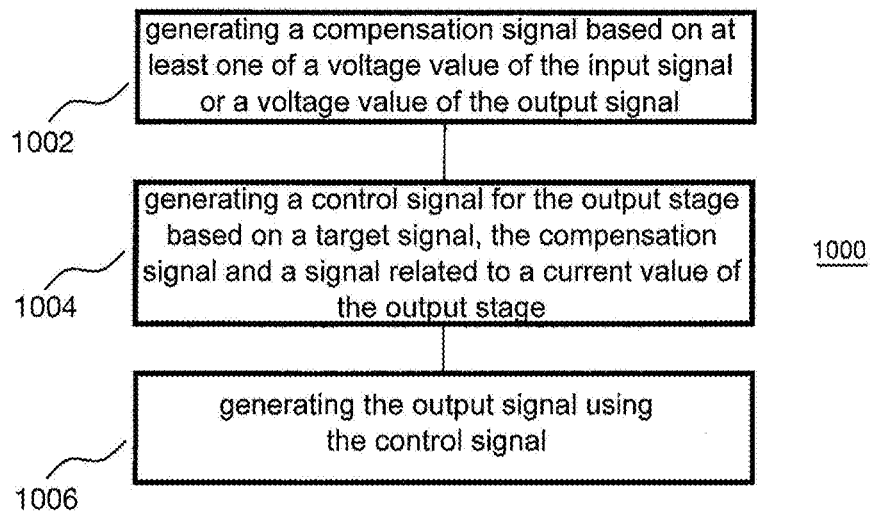
FIG. 10 illustrates a flowchart of an example of a method for amplifying an input signal to provide an output signal via an output stage.

An example of a method 1000 for amplifying an input signal to provide an output signal via an output stage is illustrated by means of a flowchart in FIG. 10. The method comprises generating 1002 a compensation signal based on at least one of a voltage value of the input signal or a voltage value of the output signal. Further, the method comprises generating 1004 a control signal for the output stage based on a target signal, the compensation signal and a signal related to a current value of the output stage. The target signal corresponds to a desired output signal. The method further comprises generating 1006 the output signal using the control signal.

More details and aspects of the method are mentioned in connection with the proposed concept or one or more examples described above or below (e.g. FIGS. 1-9). The method may comprise one or more additional optional features corresponding to one or more aspects of the proposed concept or one or more examples described above or below.

Figure 11:
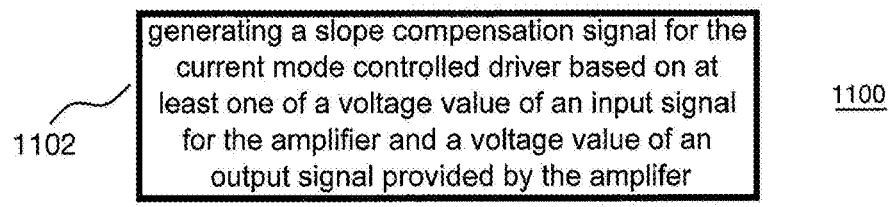
FIG. 11 illustrates a flowchart of an example of a method for controlling a current mode controlled driver of an amplifier.

An example of a method 1100 for controlling a current mode controlled driver of an amplifier is illustrated by means of a flowchart in FIG. 11. The method comprises generating 1102 a slope compensation signal for the current mode controlled driver based on at least one of a voltage value of an input signal for the amplifier or a voltage value of an output signal provided by the amplifier.

More details and aspects of the method are mentioned in connection with the proposed concept or one or more examples described above (e.g. FIGS. 1-9). The method may comprise one or more additional optional features corresponding to one or more aspects of the proposed concept or one or more examples described above.

The examples as described herein may be summarized as follows:

Example 1 is an apparatus for amplifying an input signal, comprising: an output stage configured to generate an output signal; a compensation signal generator configured to generate a compensation signal based on at least one of a voltage value of the input signal or a voltage value of the output signal; and a combiner configured to generate a control signal for the output stage based on a target signal corresponding to a desired output signal, the compensation signal and a signal related to a current value of the output stage, wherein the output stage is configured to generate the output signal using the control signal.

In example 2, the compensation signal generator of the apparatus of example 1 is configured to generate multiple compensation signals within a working cycle of the apparatus.

In example 3, the compensation signal generator of the apparatus of example 1 is configured to generate a single compensation signal for a working cycle of the apparatus.

In example 4, the compensation signal generator of the apparatus of any of examples 1 to 3 is configured to adjust an amplitude of the compensation signal based on at least one of the voltage value of the input signal and the voltage value of the output signal.

In example 5, the compensation signal generator of the apparatus of any of the preceding examples is configured to generate the compensation signal with a triangular signal shape.

In example 6, the compensation signal generator of the apparatus of any of the preceding examples is configured to generate the compensation signal to depend linearly on at least one of the voltage value of the input signal or the voltage value of the output signal.

In example 7, the compensation signal generator of the apparatus of any of the preceding examples is configured to generate the compensation signal according to an operation which is mathematically correspondent to $S_{comp}=k_1+k_2*(V_s-V_{i/o})$, with $S_{comp}$ denoting the compensation signal, $k_1$ and $k_2$ denoting constants, V denoting a supply voltage of the apparatus and $V_{i/o}$ denoting the voltage value of the input signal, the voltage value of the output signal or a combination thereof.

In example 8, the compensation signal generator of the apparatus of any of the preceding examples is configured to generate the compensation signal wherein (i.e. such that) a gain of the output signal compared to the input signal is independent of a power of the output signal.

In example 9, the compensation signal generator of the apparatus of any of examples 1 to 8 comprises: a difference amplifier configured to generate, to a first node, a voltage difference signal by modifying a difference between a supply voltage of the apparatus and at least one of the voltage value of the input signal and the voltage value of the output signal by a gain factor, wherein the first node is coupled to a first potential; a capacitive element comprising a first electrode coupled to an output node of the compensation signal generator and a second electrode coupled to a second potential; and a voltage-to-current converter comprising an input coupled to the first node and an output coupled to the output node, wherein the voltageto-current converter is configured to charge the first electrode based on a voltage provided by the first node, wherein the compensation signal generator is configured to short-cut the output node and the second electrode of the capacitive element.

In example 10, the output stage of the apparatus of any of the preceding examples comprises an inductor-capacitor network and a capacitive element.

In example 11, the output stage of the apparatus of any of the preceding examples is based on a switching-mode power supply.

Example 12 is a slope compensation signal generator for a current mode controlled driver of an amplifier, wherein the slope compensation signal generator is configured to generate a slope compensation signal for the current mode controlled driver based on at least one of a voltage value of an input signal for the amplifier or a voltage value of an output signal provided by the amplifier.

In example 13 the slope compensation signal generator of example 12 is configured to generate multiple slope compensation signals within a working cycle of the current mode controlled driver.

In example 14, the slope compensation signal generator of example 12 is configured to generate a single slope compensation signal for a working cycle of the current mode controlled driver.

In example 15, the slope compensation signal generator of any of examples 12 to 14 is configured to adjust an amplitude of the slope compensation signal based on at least one of the voltage value of the input signal or the voltage value of the output signal.

In example 16, the slope compensation signal generator of any of the preceding examples is configured to provide the slope compensation signal to depend linearly on at least one of the voltage value of the input signal or the voltage value of the output signal.

In example 17, the slope compensation signal generator of any of the preceding examples is configured to generate the slope compensation signal wherein (i.e. such that) a signal gain of the amplifier is independent of a power of the output signal.

Example 18 is a transmitter comprising an apparatus for amplifying an input signal according to any of examples 1 to 11 or a slope compensation signal generator according to any of examples 12 to 17, which is coupled to a current mode controlled driver of an amplifier.

In example 19, the input signal of the transmitter of example 18 is based on a radio frequency transmit signal.

Example 20 is a mobile communications device comprising a transmitter according to any of examples 18 or 19.

In example 21, the mobile communications device of example 20 further comprises at least one antenna coupled to the transmitter.

Example 22 is a means for amplifying an input signal to provide an output signal via a means for providing an output signal, comprising: a means for generating a compensation signal based on at least one of a voltage value of the input signal or a voltage value of the output signal; and a means for generating a control signal for the means for generating an output signal based on a target signal corresponding to a desired output signal, the compensation signal and a signal related to a current value of the output stage, wherein the means for generating an output signal is configured to generate the output signal based on the control signal.

In example 23, the means for generating the compensation signal of the means for amplifying an input signal of example 22 is configured to generate the compensation signal wherein (i.e. such that) a gain of the output signal compared to the input signal is independent of a power of the output signal.

Example 24 is a means for a current mode controlled driver of an amplifier, wherein the means is configured to generate a slope compensation signal for the current mode controlled driver based on at least one of a voltage value of an input signal for the amplifier or a voltage value of an output signal provided by the amplifier.

In example 25, the means of example 24 is configured to generate the slope compensation signal wherein (i.e. such that) a signal gain of the amplifier is independent of a power of the output signal.

Example 26 is a method for amplifying an input signal to provide an output signal via an output stage, comprising: generating a compensation signal based on at least one of a voltage value of the input signal or a voltage value of the output signal; generating a control signal for the output stage based on a target signal, the compensation signal and a signal related to a current value of the output stage; and generating the output signal using the control signal, wherein the target signal corresponds to a desired output signal.

In example 27, multiple compensation signals are generated within a working cycle in the method of example 26.

In example 28, a single compensation signal is generated for a working cycle in the method of example 26.

In example 29, generating the compensation signal in the method of any of examples 26 to 28 comprises adjusting an amplitude of the compensation signal based on at least one of the voltage value of the input signal and the voltage value of the output signal.

In example 30, generating the compensation signal in the method in any of the preceding examples comprises generating the compensation signal with a triangular signal shape.

In example 31, generating the compensation signal in the method of any of the preceding examples comprises generating the compensation signal to depend linearly on at least one of the voltage value of the input signal or the voltage value of the output signal.

In example 32, generating the compensation signal in the method of any of the preceding examples comprises generating the compensation signal according to an operation which is mathematically correspondent to $S_{comp} = k_1 + k_2 * (V_s - V_{i/o})$, with $S_{comp}$ denoting the compensation signal, $k_1$ and $k_2$ denoting constants, V denoting a supply voltage of the output stage and $V_{i/o}$ denoting the voltage value of the input signal, the voltage value of the output signal or a combination thereof.

In example 33, generating the compensation signal in the method of any of the preceding examples comprises generating the compensation signal wherein (i.e. such that) a gain of the output signal compared to the input signal is independent from a power of the output signal.

Example 34 is a method for controlling a current mode controlled driver of an amplifier, comprising: generating a slope compensation signal for the current mode controlled driver based on at least one of a voltage value of an input signal for the amplifier or a voltage value of an output signal provided by the amplifier.

In example 35, multiple slope compensation signals are generated within a working cycle of the current mode controlled driver in the method of example 34.

In example 36, a single slope compensation signal is generated for a working cycle of the current mode controlled driver in the method of example 34.

In example 37, generating the slope compensation signal in the method of any of examples 34 to 36 comprises adjusting an amplitude of the slope compensation signal based on at least one of the voltage value of the input signal and the voltage value of the output signal.

In example 38, generating the slope compensation signal in the method of any of examples 34 to 37 comprises generating the slope compensation signal to depend linearly on at least one of the voltage value of the input signal or the voltage value of the output signal.

In example 39, generating the slope compensation signal in the method of any of examples 34 to 38 comprises generating the slope compensation signal wherein (i.e. such that) a signal gain of the amplifier is independent from a power of the output signal.

Example 40 is a computer readable storage medium having stored thereon a program having a program code for performing the method of any of examples 26 to 39, when the program is executed on a computer or processor.

Example 41 is a computer program having a program code configured to perform the method of any of examples 26 to 39, when the computer program is executed on a computer or processor.

Examples may further provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the detailed description, where each claim may stand on its own as a separate examples. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub acts may be included and part of the disclosure of this single act unless explicitly excluded.

What is claimed is:

1. An apparatus for amplifying an input signal, comprising:
   a power converter configured to generate an output signal;
   a compensation signal generator configured to generate a compensation signal based on at least one of a voltage value of the input signal or a voltage value of the output signal; and a combiner configured to generate a control signal for the power converter based on a target signal corresponding to a desired output signal, the compensation signal, and a signal related to a current value of the power converter, wherein the power converter is configured to generate the output signal using the control signal, and wherein the compensation signal generator is configured to generate multiple compensation signals within a working cycle of the apparatus.

2. The apparatus of claim 1, wherein the compensation signal generator is configured to generate the compensation signal with a triangular signal shape.

3. The apparatus of claim 1, wherein the compensation signal generator is configured to generate the compensation signal to depend linearly on at least one of the voltage value of the input signal or the voltage value of the output signal.

4. The apparatus of claim 1, wherein the compensation signal generator is configured to generate the compensation signal wherein a gain of the output signal compared to the input signal is independent of a power of the output signal.

5. The apparatus of claim 1, wherein the power converter comprises an inductor-capacitor network and a capacitive element.

6. The apparatus of claim 1, wherein the power converter is based on a switching-mode power supply.

7. A method for amplifying an input signal to provide an output signal via power converter, comprising:

generating a compensation signal based on at least one of a voltage value of the input signal or a voltage value of the output signal;

generating a control signal for the power converter based on a target signal, the compensation signal, and a signal related to a current value of the power converter; and generating the output signal using the control signal, wherein multiple compensation signals are generated within a working cycle of the method.

8. The method of claim 7, wherein generating the compensation signal comprises generating the compensation signal with a triangular signal shape.

9. The method of claim 7, wherein generating the compensation signal comprises generating the compensation signal to depend linearly on at least one of the voltage value of the input signal or the voltage value of the output signal.

10. The method of claim 7, wherein generating the compensation signal comprises generating the compensation signal wherein a gain of the output signal compared to the input signal is independent from a power of the output signal.

11. The apparatus of claim 1, wherein the compensation signal generator is configured to adjust an amplitude of the compensation signal based on the least one of the voltage value of the input signal or the voltage of the output signal.

12. The method of claim 7, further comprising:

adjusting an amplitude of the compensation signal based on at least one of a voltage value of the input signal or a voltage value of the output signal.

13. A means for amplifying an input signal to provide an output signal via a means for providing an output signal, comprising:

a means for generating a compensation signal based on at least one of a voltage value of the input signal or a voltage value of the output signal; and a means for generating a control signal for the means for generating an output signal based on a target signal corresponding to a desired output signal, the compensation signal, and a signal related to a current value of the power converter, wherein the means for generating an output signal is configured to generate the output signal based on the control signal.

* * * * *